(12) United States Patent
Den Boef et al.

(10) Patent No.: US 8,488,107 B2
(45) Date of Patent: Jul. 16, 2013

(54) LITHOGRAPHIC APPARATUS AND DEVICE MANUFACTURING METHOD INVOLVING A LEVEL SENSOR HAVING MULTIPLE PROJECTION UNITS AND DETECTION UNITS

(75) Inventors: Arie Jeffrey Den Boef, Waalre (NL); Frank Staals, Eindhoven (NL); Lukasz Jerzy Macht, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/178,965

(22) Filed: Jul. 8, 2011

(65) Prior Publication Data
US 2012/0013879 A1    Jan. 19, 2012

Related U.S. Application Data (63) Continuation-in-part of application No. 12/722,924, filed on Mar. 12, 2010, now Pat. No. 8,351,024.

(60) Provisional application No. 61/160,126, filed on Mar. 13, 2009.

(51) Int. Cl.
*G03B 27/58* (2006.01)

(52) U.S. Cl.
USPC .......................................................... 355/72

(58) Field of Classification Search
USPC .......................................... 355/72, 71, 55, 53
See application file for complete search history.

(56) References Cited

U.S. PATENT DOCUMENTS

| | | |
|---|---|---|
| 4,902,900 A | 2/1990 | Kamiya et al. |
| 5,101,226 A | 3/1992 | Beaulieu et al. |
| 5,191,200 A | 3/1993 | van der Werf et al. |
| 5,241,188 A | 8/1993 | Mizutani |

(Continued)

FOREIGN PATENT DOCUMENTS

| | | |
|---|---|---|
| EP | 1 037 117 | 9/2000 |
| JP | 1-253603 | 10/1989 |

(Continued)

OTHER PUBLICATIONS

R.A. Synowicki et al., "Refractive Index Measurements of Photoresist and Antireflective Coatings with Variable Angle Spectroscopic Ellipsometry," Proc. of SPIE, vol. 3332, pp. 384-390 (1998).

(Continued)

*Primary Examiner* — Toan Ton
*Assistant Examiner* — Chia-how Michael Liu
(74) *Attorney, Agent, or Firm* — Pillsbury Winthrop Shaw Pittman LLP (57) ABSTRACT

The invention provides a level sensor configured to determine a height level of a surface of a substrate supported on a movable substrate support, the level sensor including multiple projection units, multiple detection units, and a processing unit to calculate a height level for each of a plurality of measurement locations on the basis of the measurement beams from the projection units, wherein the level sensor is configured to measure height levels simultaneously at multiple measurement locations on the substrate, wherein the substrate support is configured to move the substrate in a first direction substantially parallel to the surface of the substrate to measure a height level at different locations on the substrate, and wherein at least part of the multiple measurement locations are at least spaced in a second direction that is substantially parallel to the surface of the substrate and perpendicular to the first direction.

16 Claims, 8 Drawing Sheets

U.S. PATENT DOCUMENTS

| | | | |
|---|---|---|---|
| 5,448,332 | A | 9/1995 | Sakakibara et al. |
| 5,461,237 | A | 10/1995 | Wakamoto et al. |
| 5,581,348 | A | 12/1996 | Miura et al. |
| 5,969,820 | A | 10/1999 | Yoshii et al. |
| 6,245,585 | B1 | 6/2001 | Fujimoto |
| 6,268,923 | B1 | 7/2001 | Michniewicz et al. |
| 6,674,510 | B1 | 1/2004 | Jasper et al. |
| 6,704,089 | B2 | 3/2004 | van der Schaar et al. |
| 7,206,058 | B2 | 4/2007 | Modderman et al. |
| 7,224,431 | B2 | 5/2007 | Mulkens et al. |
| 8,345,265 | B2 | 1/2013 | Bijvoet |
| 2002/0006560 | A1 | 1/2002 | van der Schaar et al. |
| 2003/0193655 | A1 | 10/2003 | Ina |
| 2004/0165169 | A1 | 8/2004 | Teunissen et al. |
| 2005/0274909 | A1 | 12/2005 | Teunissen et al. |
| 2006/0082752 | A1 | 4/2006 | Bleeker et al. |
| 2006/0138347 | A1 | 6/2006 | Bruinsma et al. |
| 2006/0158626 | A1 | 7/2006 | Baselmans et al. |
| 2007/0206204 | A1 | 9/2007 | Jia et al. |
| 2007/0229788 | A1 | 10/2007 | Kosugi |
| 2008/0079920 | A1 | 4/2008 | Hommen et al. |
| 2008/0151204 | A1 | 6/2008 | Van De Vin et al. |
| 2008/0309915 | A1 | 12/2008 | Van Asten et al. |
| 2009/0231563 | A1 | 9/2009 | Staals et al. |
| 2009/0296090 | A1 | 12/2009 | Saha et al. |
| 2010/0129741 | A1 | 5/2010 | Bijvoet |
| 2011/0164229 | A1 | 7/2011 | Staals et al. |
| 2011/0222044 | A1 | 9/2011 | Van Drent |

FOREIGN PATENT DOCUMENTS

| | | |
|---|---|---|
| JP | 2-037709 | 2/1990 |
| JP | 4-045913 | 2/1992 |
| JP | 04-342111 | 11/1992 |
| JP | 6-066543 | 3/1994 |
| JP | H06-194358 | 7/1994 |
| JP | 7-074088 | 3/1995 |
| JP | 7-106243 | 4/1995 |
| JP | 8-068667 | 3/1996 |
| JP | 2000-323404 | 11/2000 |
| JP | 2002-340524 | 11/2002 |
| JP | 2004-281665 | 10/2004 |
| JP | 2009-182334 | 8/2009 |
| JP | 2011-209278 | 10/2011 |
| KR | 20-1995-0021360 U | 7/1995 |
| KR | 10-2000-0022814 | 4/2000 |
| KR | 2009-0097809 | 9/2009 |
| KR | 2009-0125010 | 12/2009 |
| TW | 497012 | 8/2002 |

OTHER PUBLICATIONS

Singapore Search and Examination Report mailed Oct. 31, 2011 in corresponding Singapore Patent Application No. 201001507-1.

Korean Office Action dated May 16, 2011 in corresponding Korean Patent Application No. 10-2010-0022284.

Korean Office Action dated Jan. 19, 2012 in corresponding Korean Patent Application No. 10-2010-0022284.

Japanese Office Action mailed Mar. 6, 2012 in corresponding Japanese Patent Application No. 2010-052645.

Korean Office Action dated Apr. 9, 2012 in corresponding Korean Patent Application No. 10-2011-0022123.

U.S. Office Action dated Aug. 2, 2012 in corresponding U.S. Appl. No. 12/722,902.

U.S. Office Action dated Jul. 10, 2012 in corresponding U.S. Appl. No. 12/722,955.

U.S. Office Action dated Dec. 21, 2012 in corresponding U.S. Appl. No. 12/722,902.

Chinese Office Action dated Dec. 3, 2012 in corresponding Chinese Patent Application No, 201110059239.2.

U.S. Office Action dated Mar. 22, 2013 in corresponding U.S. Appl. No. 13/045,052.

U.S. Office Action dated Mar. 29, 2013 in corresponding U.S. Appl. No. 13/603,168.

Taiwan Office Action dated Feb. 26, 2013 in corresponding Taiwan Patent Application No. 099107118.

LITHOGRAPHIC APPARATUS AND DEVICE MANUFACTURING METHOD INVOLVING A LEVEL SENSOR HAVING MULTIPLE PROJECTION UNITS AND DETECTION UNITS

This application is a continuation-in-part application of U.S. patent application Ser. No. 12/722,924, entitled "Lithographic Apparatus and Device Manufacturing Method", filed Mar. 12, 2010 now U.S. Pat. No. 8,351,024, which claims priority and benefit to U.S. Provisional patent application Ser. No. 61/160,126, entitled "Level Sensor Arrangement for Lithographic Apparatus and Device Manufacturing Method", filed on Mar. 13, 2009. The contents of each of the foregoing applications is incorporated herein in its entirety by reference.

FIELD

The present invention relates to a combination of a substrate support and a level sensor, a lithographic apparatus and a method for determining a height map of a substrate for use in a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The surface of a substrate on which a pattern should be projected is usually not completely flat. Moreover, a substrate can show thickness variation of several microns. This flatness and/or thickness variation of the substrate surface may result in incorrect projection of the pattern, for instance due to focus errors or imaging errors.

To correct for unflatness and/or thickness variation of a substrate, it has been proposed to provide a level sensor, desirably integrated in the lithographic apparatus. Such a level sensor may be used to determine a height map of a substrate, before a pattern is transferred, e.g., projected, on the substrate. This height map may subsequently be used to correct the position of the substrate during transfer of the pattern on the substrate.

SUMMARY

A multiple spot level sensor using optical triangulation may be provided to determine a height map of the substrate. The substrate is moved with respect to the level sensor to determine a height level at different measurement locations across the surface of the substrate to obtain a height map of the substrate.

A potential drawback of this level sensor is that the measurement range of the level sensor is only sufficiently linear to obtain reliable measurement results in a height range of about 1 μm. This measurement range is smaller than the normal variation in flatness and/or height of a substrate. Further measures should be taken to accurately determine a height map of the substrate.

Although it is possible to use linearization techniques to improve accuracy of the level sensor, the height range in which reliable results are obtained, when using these techniques, is still relatively small with respect to normal variation in flatness and/or thickness of a substrate.

Therefore, a closed-loop height control may be used during measurement of the height level at different measurement locations on the substrate to maintain the respective measurement locations within the reliable measurement range of the level sensor. In this way the small height range in which the level sensor provides accurate results, is optimally used. However, closed-loop height control limits the measurement speed of the level sensor, since the substrate has to be continuously repositioned to maintain the subsequent measurement locations within the reliable measurement range of the level sensor.

Moreover, closed-loop height control makes simultaneous height measurement at multiple measurement location practically difficult, if not impossible, since the multiple measurement locations cannot be arranged simultaneously within the same limited measurement range of the level sensor.

It is desirable, for example, to provide an alternative level sensor for use in a lithographic apparatus which level sensor preferably provides efficient measurement of height levels of a surface of the substrate.

According to an embodiment of the invention, there is provided a level sensor configured to determine a height level of a surface of a substrate supported on a movable substrate support, comprising:

multiple projection units, each projection unit configured to project a measurement beam on a measurement location on the substrate, multiple detection units, each detection unit arranged to receive the measurement beam after redirection by the substrate, and a processing unit to calculate a height level for each of the measurement locations on the basis of the measurement beams, wherein the level sensor is configured to measure height levels simultaneously at multiple measurement locations on the substrate, wherein the substrate support is configured to move the substrate in a first direction substantially parallel to the surface of the substrate to measure a height level of the surface at different locations on the substrate, and wherein at least part of the multiple measurement locations are at least spaced in a second direction that is substantially parallel to the surface of the substrate and substantially perpendicular to the first direction.

According to an embodiment of the invention, there is provided a lithographic apparatus comprising:

a support constructed to support a patterning device, the patterning device being capable of providing a radiation beam having a pattern in its cross-section;

a movable substrate table constructed to hold a substrate;

a projection system configured to project the patterned radiation beam onto a target portion of the substrate; and a level sensor configured to determine a height level of a surface of the substrate supported on the substrate table, the level sensor comprising:

multiple projection units, each projection unit configured to project a measurement beam on a measurement location on the substrate, multiple detection units, each detection unit arranged to receive the measurement beam after redirection by the substrate, and a processing unit to calculate a height level on the basis of the measurement beams, wherein the level sensor is configured to measure height levels simultaneously at multiple measurement locations on the substrate, wherein the substrate table is configured to move the substrate in a first direction substantially parallel to the surface of the substrate, and wherein at least part of the multiple measurement locations are at least spaced in a second direction that is substantially parallel to the surface of the substrate and substantially perpendicular to the first direction.

According to an embodiment of the invention, there is provided a method for determining a height map of a substrate for use in a lithographic process, the method comprising:

projecting a plurality of measurement beams on respective measurement locations on the substrate using multiple projection units;

receiving each of the measurement beams after redirection by the substrate using a respective detection unit of a plurality of detection units;

calculating a height level for each of the measurement locations on the basis of the measurement beams in order to measure the height levels simultaneously at the multiple measurement locations on the substrate; and moving the substrate in a first direction substantially parallel to the surface of the substrate to measure a height level of the surface at different locations on the substrate; and determining a height map of the substrate on the basis of the height levels measured at the different locations, wherein at least part of the multiple measurement locations are at least spaced in a second direction that is substantially parallel to the surface of the substrate and substantially perpendicular to the first direction.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6b depicts a top view of the level sensor of FIG. 6a;

DETAILED DESCRIPTION

Figure 1:
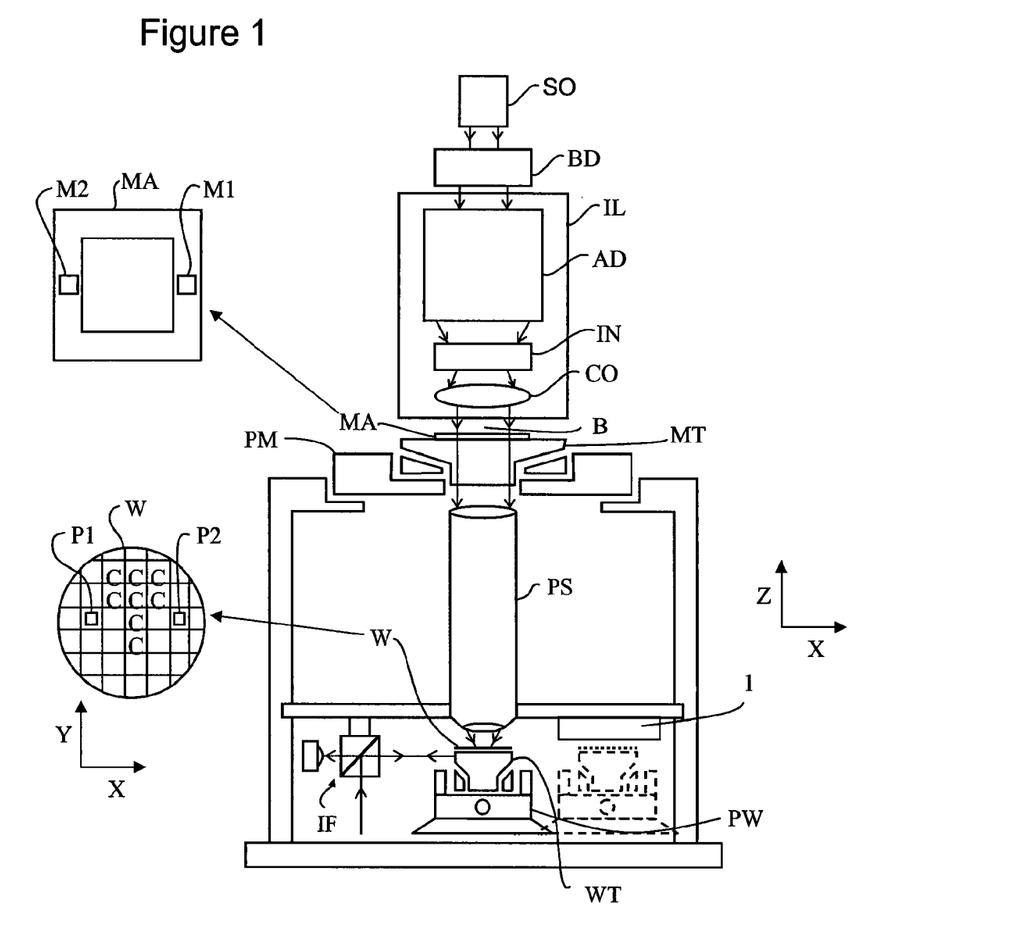
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support structure (e.g. a mask table) MT constructed to support a patterning device (e.g. a mask) MA and connected to a first positioning device PM configured to accurately position the patterning device in accordance with certain parameters. The apparatus also includes a substrate support (e.g. a wafer table) WT constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate or any device to imprint a pattern into imprintable medium. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions.

The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate supports (and/or two or more patterning device supports). In such "multiple stage" machines the additional supports may be used in parallel, or preparatory steps may be carried out on one or more supports while one or more other supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support structure (e.g., mask table) MT, and is patterned by the patterning device. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device table MT may be realized with the aid of a long-stroke module (coarse positioning) and a short-stroke module (fine positioning), which form part of the first positioning device PM. Similarly, movement of the substrate support WT may be realized using a long-stroke module and a short-stroke module, which form part of the second positioner PW. In the case of a stepper (as opposed to a scanner) the patterning device table MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device support MT and the substrate support WT are kept essentially stationary, while an entire pattern imparted to the radiation beam is projected onto a target portion C at one time (i.e. a single static exposure). The substrate support WT is then shifted in the X and/or Y direction so that a different target portion C can be exposed. In step mode, the maximum size of the exposure field limits the size of the target portion C imaged in a single static exposure.

2. In scan mode, the patterning device support MT and the substrate support WT are scanned synchronously while a pattern imparted to the radiation beam is projected onto a target portion C (i.e. a single dynamic exposure). The velocity and direction of the substrate support WT relative to the patterning device support MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support MT is kept essentially stationary holding a programmable patterning device, and the substrate support WT is moved or scanned while a pattern imparted to the radiation beam is projected onto a target portion C. In this mode, generally a pulsed radiation source is employed and the programmable patterning device is updated as required after each movement of the substrate support WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In FIG. 1 the possible location of a level sensor 1 according to an embodiment of the invention in a lithographic apparatus is shown. The substrate support WT and substrate W supported thereon are shown in dashed lines in a measurement location of the substrate. In this measurement location a height level of the substrate W may be determined.

Level Sensor

Figure 2:
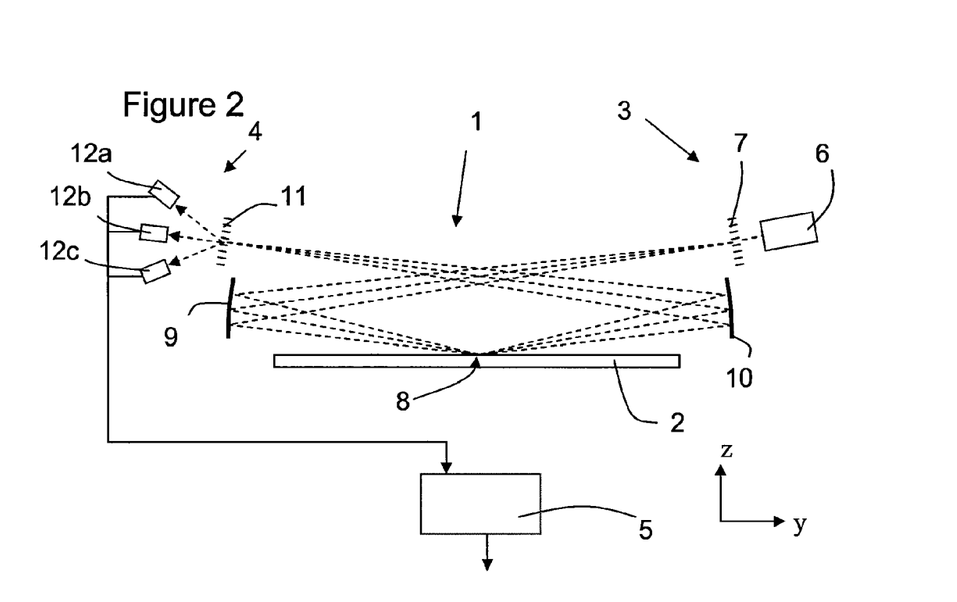
FIG. 2 depicts a side view of a level sensor according to an embodiment of the invention.

FIG. 2 shows a level sensor generally indicated by reference numeral 1. The level sensor 1 is configured to determine a height map of a substrate 2. This height map may be used to correct the position of a substrate during projection of a pattern on the substrate 2. The level sensor may be arranged in a stand-alone device, but is desirably integrated in a lithographic apparatus as shown in FIG. 1.

The level sensor 1 comprises a projection unit 3, a detection unit 4, and a processing unit 5. The projection unit 3 comprises a radiation output 6 (e.g., a radiation source or an outlet connected to a radiation source elsewhere) and a projection grating 7. The radiation output 6 may be, or connected to, any suitable radiation source. Desirably, it is, or is connected to, a broadband light source but a polarized or non-polarized laser beam can also be used. The radiation output 6 provides a measurement beam which is directed to the projection grating 7.

Figure 3:
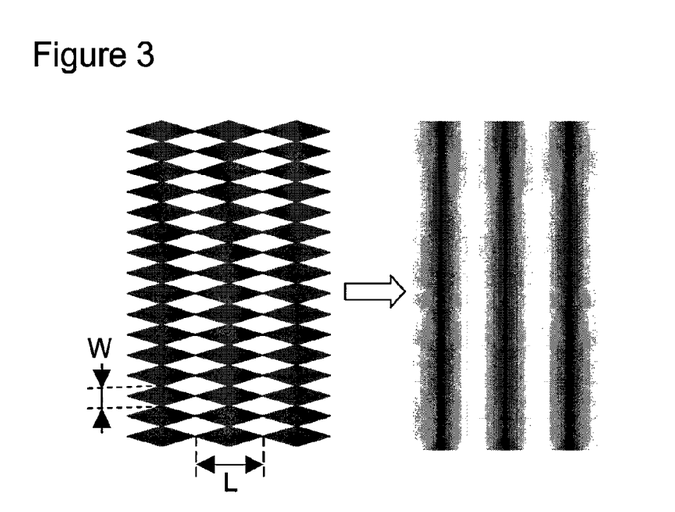
FIG. 3 depicts a schematic view of a projection grating (left side) and resulting image (right side)

The projection grating 7 comprises a periodic grating, i.e. a pattern having a periodic structure resulting in a measurement beam having a periodic structure in radiation intensity. The left side of FIG. 3 shows an example of such a projection grating having a periodic structure. The measurement beam with periodic radiation intensity is directed towards a measurement location 8 via an optical reflector 9. The substrate is located at this measurement location 8. Further optical elements may be provided to guide the measurement beam towards the substrate 2. At the measurement location 8 the measurement beam is reflected on the substrate 2 and runs via a second optical reflector 10, and possibly further optical elements to the detection unit 4. The detection unit 4 comprises a detection grating 11 and three detectors 12a, 12b, 12c.

Figure 4:
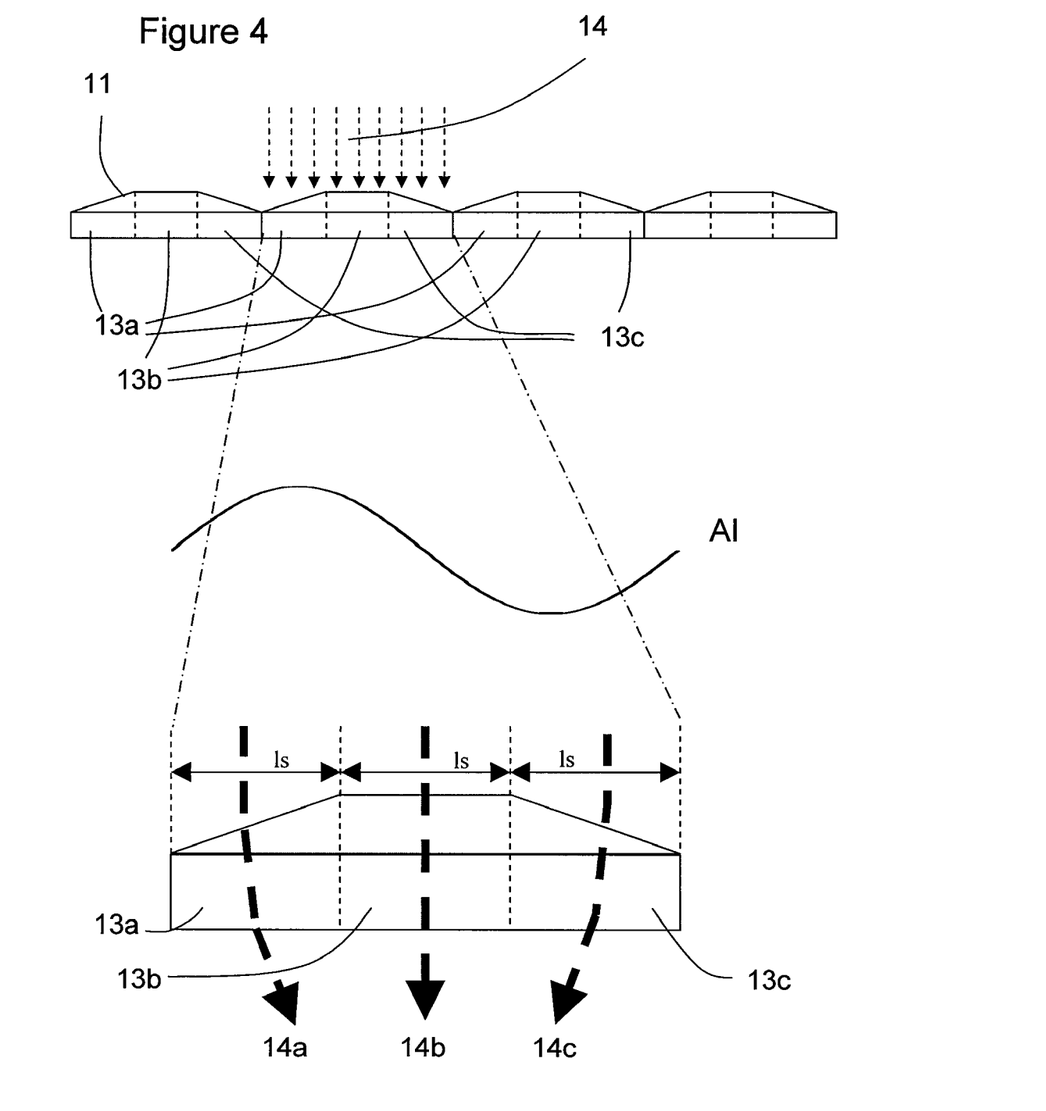
FIG. 4 depicts a side view of an embodiment of a detection grating and a detail of the detection grating.

The detection grating 11 comprises a periodic structure as shown in FIG. 4. This periodic structure comprises for each period an array of three segments 13a, 13b, 13c. The top surface of each segment within the array of segments has a different angle with respect to the angle of incidence of the measurement beam 14. As a result, the measurement beam is split by the three segments into three measurement beam parts 14a, 14b, 14c, each directed to one of the three detectors 12a, 12b, 12c, for instance photodiodes or other elements capable of measuring radiation intensity.

Since the structure of the segments of the arrays of segments is periodic, each respective segment 13a, 13b, 13c per array of segments directs the part of the measurement beam received by that segment towards the associated detector 12a, 12b, and 12c. Thus all first segments 13a direct radiation of the measurement beam towards the first detector 12a, second segments 13b of the periodic structure towards the second detector 12b, and third segments 13c of the periodic structure towards the third detector 12c.

The measured radiation intensities are received by a processing unit 5, wherein on the basis of the radiation intensities received by the different detectors, a height level of the substrate 2 can be deducted as now will be explained for an exemplary embodiment.

Again referring to FIG. 3, the periodic structure shown at the left side of FIG. 3 is configured from rhombic shapes having a length L of about 30 μm and a width W of about 4 p.m. Due to the small NA of the imaging optics used in the level sensor, the periodicity in the width direction of the projection grating is not resolved, while the periodicity in the length direction L of the projection grating 7 is resolved. It is remarked that in an alternative embodiment the periodicity may also be resolved in the width direction.

At the right side of FIG. 3, the resulting projection image of this periodic structure on the substrate 2 is shown. The image of FIG. 3 shows that the projection image has a periodicity in the length direction of the projection grating 7. This image is reflected on the top surface of the substrate 2 towards the detection unit 4. The intensity distribution received by the detection grating 11 of the detection unit 4 can be approximated by a sinusoidal intensity distribution, wherein the intensity is dependent on the length direction variable x and the shift s of the image caused by the substrate height.

$$I = A + B \cos(x+s)$$

In this equation the pitch of the sinusoidal variation is chosen equal to $2\pi$. The shift of the image s is determined by the substrate height. This shift s is determined to calculate the height of the substrate at the respective measurement location 8, while taking into account the parameters A and B which are also unknown and variable.

FIG. 4 shows, for illustration, an aerial image AI of the sinusoidal intensity distribution above the three segments 13a, 13b, and 13c. Each of the segments 13a, 13b, 13c receives another part of the intensity distribution. Due to the different angles of the segments 13a, 13b, 13c each part of the intensity distribution is guided to the respective one of the detectors 12a, 12b, 12c. The radiation intensities received by the detectors 12a, 12b, 12c are guided to the processing unit 5 to determine the height level of the substrate at the measurement location 8.

The radiation intensities D1, D2 and D3, received by each of the detectors 12a, 12b, 12c can be described by the following relations:

$$D_1 = \frac{2\pi}{3} A + B \left[ \sin\left(-\frac{\pi}{3} + s\right) - \sin(-\pi + s) \right]$$

$$D_2 = \frac{2\pi}{3} A + B \left[ \sin\left(\frac{\pi}{3} + s\right) - \sin\left(-\frac{\pi}{3} + s\right) \right]$$

$$D_3 = \frac{2\pi}{3} A + B \left[ \sin(\pi + s) - \sin\left(\frac{\pi}{3} + s\right) \right]$$

From these three equations with 3 unknown variables, two quadrature signals can be derived.

$$B\cos(s) = \frac{2D_2 - D_1 - D_3}{3\sqrt{3}}$$

$$B\sin(s) = \frac{D_1 - D_3}{3}$$

These two quadrature signals allow the value s to be found for any value of s so there are no linearity errors and no dead-zones with zero sensitivity for substrate height changes. As a result, the level sensor 1 is suitable to determine the height of the substrate in a relatively large height range of more than +/−5 μm, or even +/−10 μm. Therefore, the need of closed-loop height control during measuring of the height level may be obviated.

In an further embodiment, the detection grating may comprise four or more segments for each period of the measurement beam. In the embodiment shown in FIG. 4, the segments 13a, 13b, 13c each have the same length ls. In an alternative embodiment, the segments may have different lengths, as long as the length of the complete array of segments corresponds to a period of the image of the measurement beam projected on the detection grating 11.

The angles of the top surfaces of the segments are about −15°, 0° and 15° with respect to the main plane of the detection grating 11. Any other suitable angle may be applied for each of the segments. The difference between the angles should be large enough to split the measurement beam in three distinguishable beam parts that can be directed to the three distinct detectors 12a, 12b, 12c, so that intensity differences between the three beam parts can be determined.

Since the measurement of a height level of the substrate 2 can be measured open-loop, and in a relatively large height range, the level sensor 1 is suitable for measuring simultaneously the height level at multiple measurement locations 8. To locate the measurement location 8 of the level sensor 1 at different positions on the substrate 2, different methods may be applied.

In an embodiment, the substrate 2 may be moved along the level sensor 1 in a scanning movement. Since no closed loop height control may be required, this movement can be made at a constant speed therewith avoiding the need of accelerations of the substrate support supporting the substrate 2 during determining a height level of a substrate. In an further embodiment, the level sensor 1 may be moved over the substrate 2 while the substrate is stationary. In a further embodiment, both the level sensor 1 and the substrate may be moved to obtain an optimum path to move the measurement locations over the surface of the substrate.

In an embodiment, the level sensor may be provided with a movable radiation guiding device configured to direct the measurement beam at different locations on the substrate without moving the complete level sensor and/or substrate. With such a level sensor, at least the height of a part of a substrate, for instance a line of measurement locations, may be measured without movement of the complete level sensor and/or substrate being required. In such an embodiment, fewer movements or less complex movements of the substrate with respect to the level sensor may be necessary to obtain a height map of a complete substrate.

Figure 5:
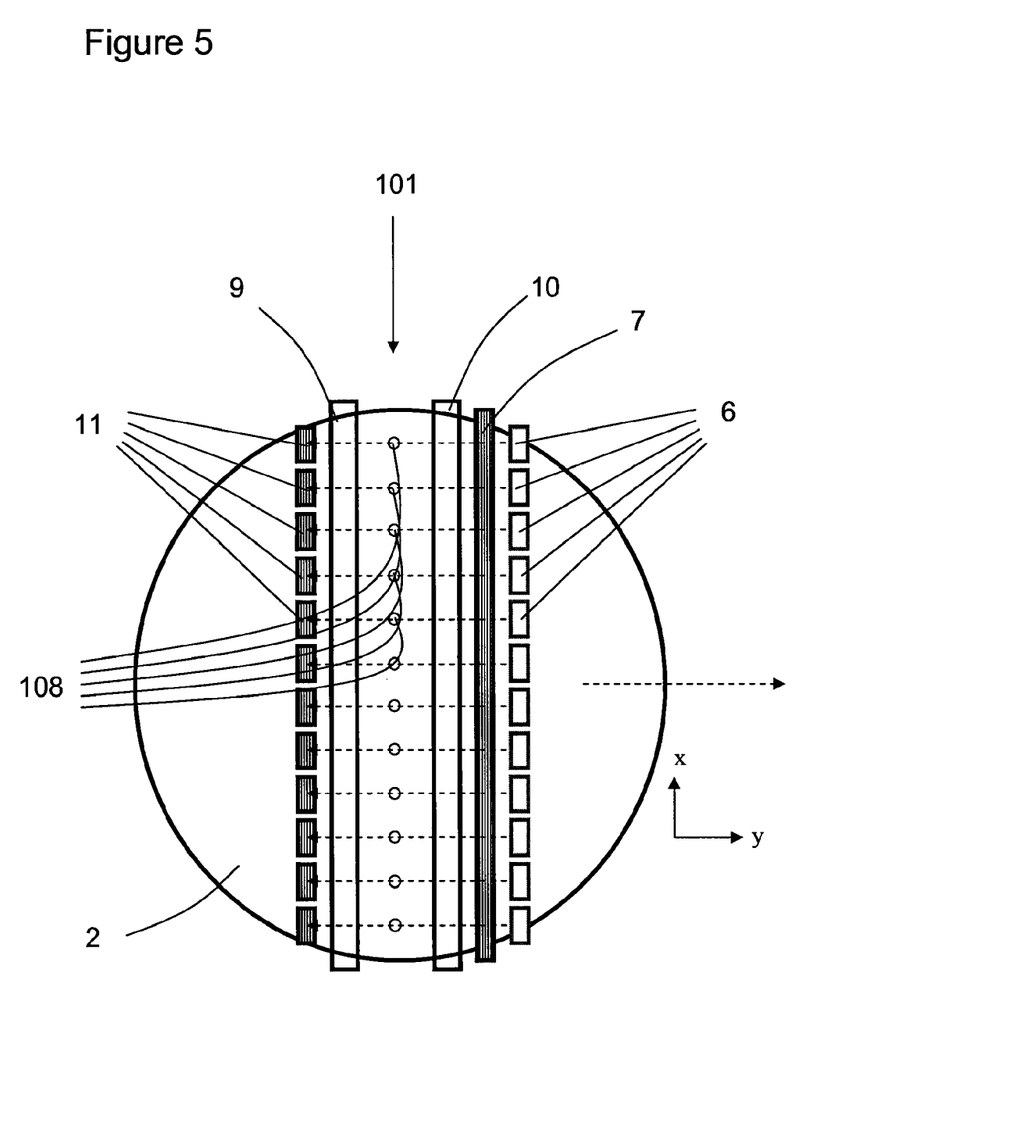
FIG. 5 depicts a top view of an embodiment of a level sensor having multiple measurement locations.

FIG. 5 shows a further embodiment of a level sensor 101. In the level sensor 101 of FIG. 5, the same or similar features of the embodiment of FIG. 2 are indicated with the same reference numerals.

The level sensor 101 is configured to measure a height of a substrate at different measurement locations 108 spaced on a line crossing the width of the substrate 2. For each measurement location 108, the level sensor 101 comprises the components of the level sensor shown in FIG. 2. Thus each measurement location 108 is associated with a projection unit comprising a radiation output 6 and a projection grating 7, and a detection unit comprising a detection grating 11 and a number of detectors (not shown). Furthermore, optical elements 9 and 10 are provided to guide the measurement beam from the projection unit to the measurement location and, after reflection on substrate 2, from the measurement location to the detection unit.

In the depicted embodiment, for each measurement location 108, one radiation output 6, one detection grating 11 and a set of three or more detectors is provided. There is one projection grating 7 and one set of optical elements 9 and 10 for all the measurement locations. The projection grating 7 and the optical elements 9, 10 extend for this reason along the measurement locations 108.

In an alternative embodiment, one detection grating 11 may be provided to be used for all measurement locations 108. Also or alternatively, one or more parts, for instance projection grating, detection grating, etc. may be provided for multiple, but not all, measurement locations 108.

The level sensor shown in FIG. 5 is configured to measure the height of a substrate at twelve measurement locations 108. The full width of the substrate can be covered by this line of measurement locations 108. When desired more or less measurement locations 108 may be provided. The measurement locations 108 may also be arranged in other configurations than along one line as shown in the embodiment of FIG. 5.

The construction of the level sensor 1 as shown in FIG. 2 is in particular suitable to be used in a multiple measurement location level sensor since the level sensor is capable of measuring the height of the substrate 2 surface in a relatively large height range. Typically, this larger height range for measurement is larger than normal variations in thickness and/or flatness of a substrate. This larger measurement range may obviate closed-loop height control. As a result, the level sensor of FIG. 5 may be used to measure the substrate height simultaneously at multiple measurement locations 108 without the requirement of correcting the position of the substrate due to height differences between the heights of the substrate at the different measurement locations.

The multiple measurement locations 108 may be moved along the substrate to obtain height information of a large number of locations on the substrate 2. This movement may be obtained by movement of the level sensor 101, movement of the substrate 2, and/or movement of a radiation guiding element of the level sensor 101, for instance movement of the optical elements 9 and 10. A combination of these movements may be used to obtain a height map of the substrate 2 to be used for correctional movements of the substrate during the actual lithographic process.

In an embodiment, the level sensor 1 is arranged at a stationary location, and the substrate 2, for example supported by a substrate support, such as a substrate stage, is moved with respect to the level sensor 1 in a direction substantially parallel to the main surface of the substrate 2, for instance in the scan direction, the y-direction, indicated by a dashed arrow in FIG. 5. In an embodiment, the substrate 2 is moved in a direction substantially parallel to the main surface of the substrate 2 and substantially perpendicular to the scan direction (i.e. in the x-direction, so that the measurement beams of the level sensor 1 run in the y-z plane). In an embodiment, the substrate 2 may be stationary and the level sensor 1 may be moved with respect to the substrate, or both the substrate 2 and the level sensor 1 may be moved.

Figure 6A:
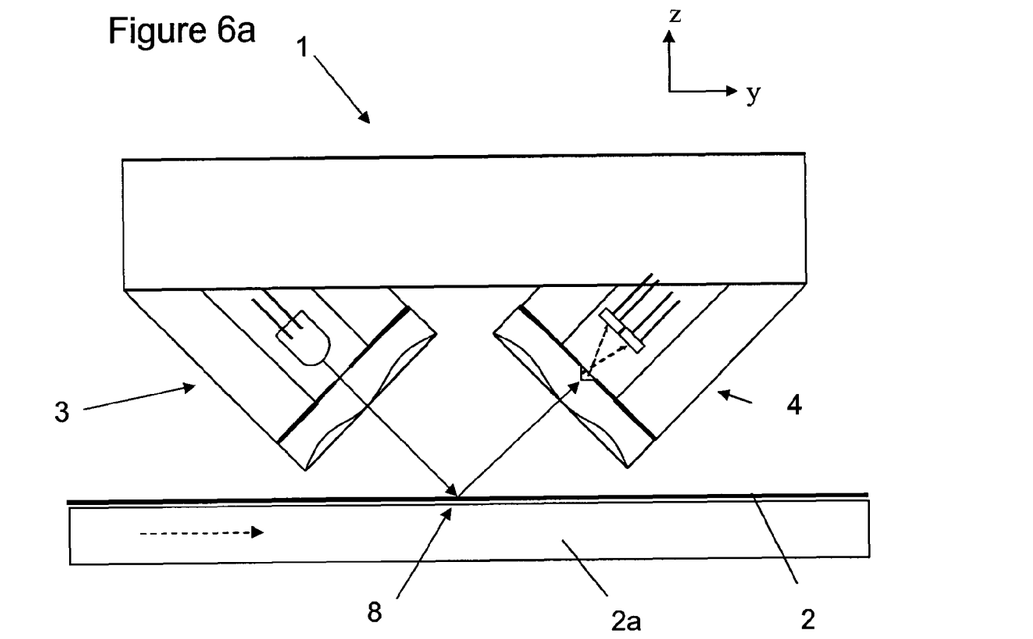
FIG. 6a depicts a side view of an embodiment of a level sensor according to an embodiment of the invention.
Figure 6B:
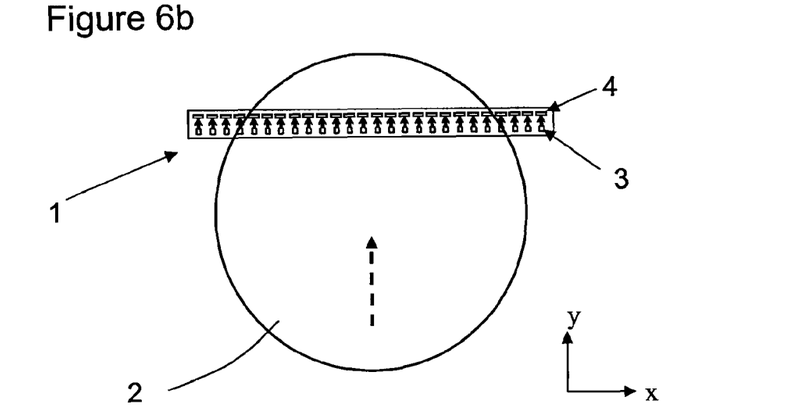

FIGS. 6a and 6b show an embodiment of a level sensor 1 according to an embodiment of the invention configured to determine a height level of a surface of a substrate 2. The level sensor 1 comprises multiple projection units 3 arranged in a row, multiple detection units 4 arranged in a row, and a processing unit (not shown) to calculate, on the basis of the measurement beams, a height level for each of the measurement locations 8.

Each projection unit 3 is configured to project a measurement beam on one of multiple measurement locations 8 on the substrate 2, and each detection unit 4 is arranged to receive the measurement beam after reflection on the substrate 2.

The substrate support 2a is configured to move the substrate in a first direction substantially parallel to the top surface of the substrate 2 to measure a height level at different locations on the substrate 2. In FIGS. 6a and 6b this first direction is the y-direction as indicated by dashed arrows. The substrate support is, for example, a substrate table of a lithographic apparatus, but may also or instead be a movable support being part of a separate level sensor system.

The multiple measurement locations 8 are arranged equidistantly on a straight measurement line on the substrate 2. The measurement line runs in the x-direction substantially perpendicular to the y-direction. The multiple measurement locations 8 substantially extend at least over a part of the width of the substrate in the x-direction. In an embodiment, the multiple measurement locations 8 extend over the full width of the substrate in the x-direction. Since the number of combinations of a projection unit and detection unit can easily be expanded in the x-direction to cover the whole width (e.g., diameter) of the substrate, the level sensor may be configured for any substrate width. The number of combinations of projection units 3 and detection units 4 on such a measurement row may, for instance, be at least 50 or at least 100 to cover the whole width of the substrate 2. The density of the measurement locations 8 may be adapted, for example by changing the distance between adjacent measurement locations 8.

Each measurement beam substantially travels through a measurement plane extending in the y-direction and the z-direction perpendicular to the x-direction and y-direction, in this case the y-z plane. As a result thereof and the movement of the substrate 2 the measurement locations 8 on the substrate 2 remain substantially in the same y-z plane.

The substrate support 2a may be configured to move the substrate in the first direction with a substantially constant speed and without closed loop height control, as explained above, when measuring height levels of the substrate at different locations on the substrate.

By use of the level sensor 1 and moving the substrate 2 supported by the substrate support 2a in the y-direction the height of the substrate across the whole surface of the substrate 2 can be measured. This can provide a very efficient determination of height levels of the surface of the substrate.

The level sensor 1 according to an embodiment of the invention can measure the full substrate 2 in only one measurement (i.e. in only one stroke), while maintaining a relatively low weight and a small volume of the components of the level sensor. In contrast, a typical level sensor is usually smaller than the level sensor according to an embodiment of the invention and measures the height of the surface of the substrate with several measurements (i.e. by measuring during several strokes of the substrate so that the complete surface of the substrate has been measured). Additionally or alternatively, the level sensor 1 according to an embodiment of the invention can easily be extended if necessary. So if the width (diameter) of the substrate will be increased the level sensor can be easily extended to cover the full width of the increased substrate width without becoming heavy and bulky and without creating difficulties in manufacturing. A further possible advantage of the level sensor described herein with respect to a typical level sensor is that, because the level sensor described herein covers much, if not all, of the width of the substrate, more individual measurements can be performed at the same time so that very easily an accurate grid of the substrate may be achieved.

The multiple projection units 3 of the level sensor 1 may use wide band blue or UV LEDs to reduce or minimize process dependencies. Alternatively a combination of a light source and a plurality of fibers may be used for the multiple projection units, which is considered a relatively cheap alternative. The multiple projection units 3 and the multiple detection units 4 comprise lenses. These lenses can be part of a micro lens array. Further, the multiple detection units 4 may use a detection pyramid and double detection diodes to become insensitive for intensity variation. The multiple detection units 4 may comprise a grating. This grating can have one or multiple slits depending on the ratio between the range and the sensitivity.

Tilt Measuring Device

FIG. 2 shows a level sensor 1 capable of measuring the height of a substrate with relatively high accuracy. The level sensor may provide a reliable measurement within a height range of +/−5 μm, or even +/−10 μm or possibly even larger. However, when the image of the projection grating becomes defocused relative to the detection grating, the level sensor may become sensitive to tilt of the substrate about the x-axis. Although this effect is small, the tilt of the substrate 2 may be measured and taken into account when the height map of a substrate is determined. The correction of the determined height by taking the tilt of the substrate into account may improve the accuracy of the height map even further. An example of a level sensor capable of measuring the tilt of the substrate, will now be discussed.

Figure 7:
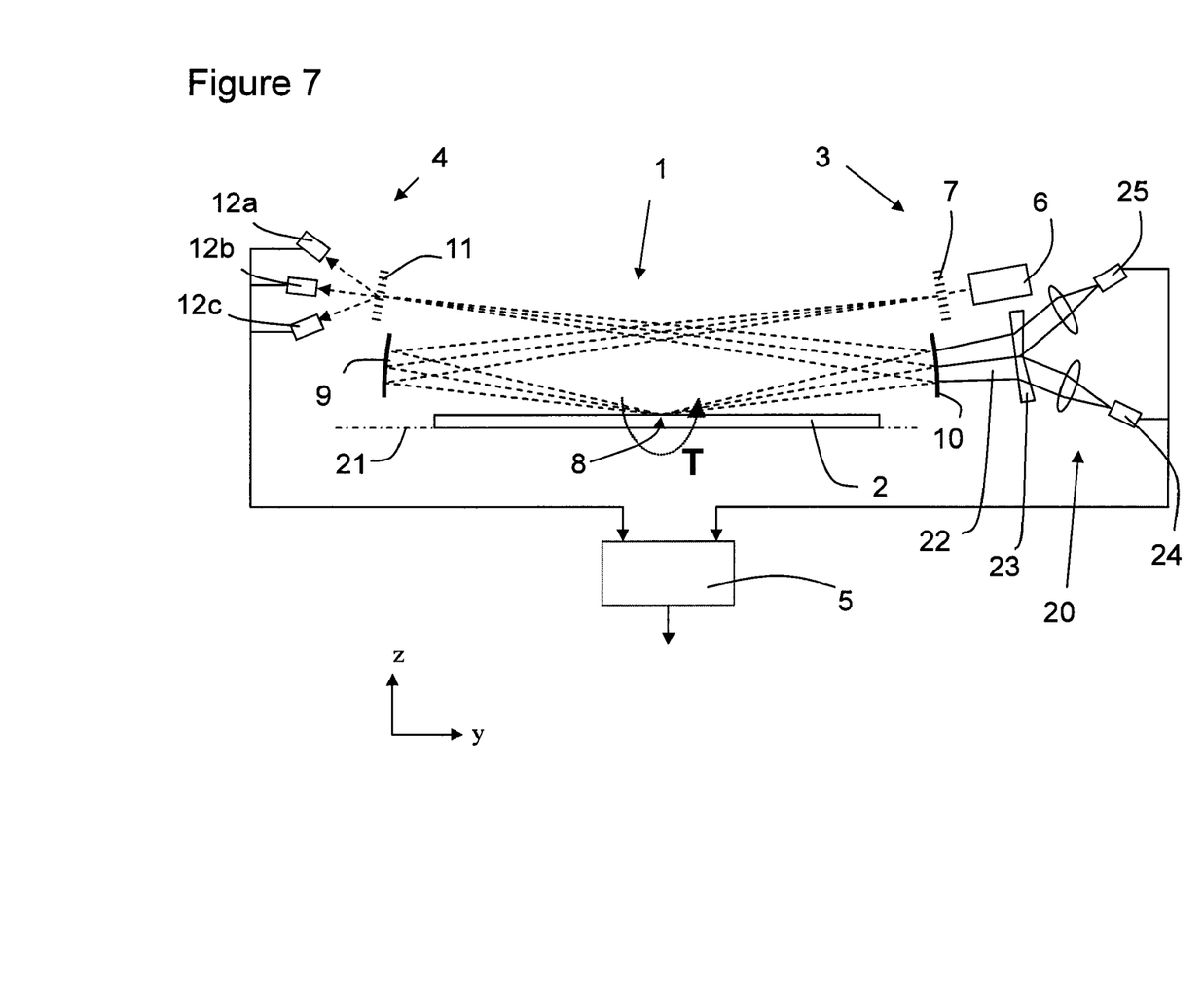
FIG. 7 depicts a side view of an embodiment of a level sensor comprising a tilt measuring device.

FIG. 7 shows the level sensor of FIG. 2, further comprising a tilt measuring device 20. The tilt measuring device 20 is arranged to receive at least part of the reflected measurement beam, and configured to provide a tilt signal representative for a tilt of the substrate about the x-axis (Rx) with respect to a nominal plane 21. The tilt measuring device 20 is connected to the processing unit 5 to feed the tilt signal to the processing unit 5 in order to correct, when needed, the height level measured by the level sensor 1.

In the level sensor 1, the measurement beam reflected on the substrate 2 is received by the optical element 10 which is a partially reflective mirror which reflects the major part of the measurement beam, for example 80% of the radiation intensity towards the detection unit 4.

The rest of the measurement beam is transmitted through the partially reflective mirror and is used to detect the tilt of the substrate in the tilt measuring device 20. This rest of the measurement beam is indicated in FIG. 7 as tilt measurement beam 22.

The tilt measurement beam 22 is received by a beam splitting device 23. The beam splitting device 23 is configured to divide the tilt measurement beam in two parts, each part directed to one of two tilt detectors 24, 25. The beam splitting device 23 comprises two wedges placed against each other. The part of the tilt measurement beam received by the lower wedge is guided to the tilt detector 24, and the part of the tilt measurement beam received by the upper wedge is guided to the tilt detector 25. The two wedges of the beam splitting device 23 are spaced in a tilt sensitive direction.

Comparison of a ratio between relative amounts of radiation received by the two tilt detectors 24, 25 is representative for the tilt of the substrate. For instance, when the substrate is tilted as indicated by the arrow T in FIG. 7, the part of the tilt measurement beam 22 received by the upper wedge will increase, while the part received by the lower wedge will decrease. The differences between the amounts of radiation received by the two tilt detectors 24, 25 can be normalized to determine small intensity differences between the radiation received by the tilt detectors 24, 25. This comparison of the amount of radiation received by the respective tilt detectors 24, 25 results in detection of small tilt variation of the substrate 2.

The tilt measuring device of FIG. 7 is only an example of a tilt sensor that can be used to measure the tilt of the substrate to correct the height determined by the tilt measurement device 20. Any other tilt measuring device 20 capable of measuring the tilt of a substrate may be applied. Generally it will be desirable to measure the tilt about an axis perpendicular to the plane in which the measurement beam of the level sensor runs. In the shown embodiment, the measurement beam runs in the y-z plane; thus the tilt to be measured is tilt of the substrate about the x-axis (Rx).

The tilt measuring device 20 as shown in FIG. 7 can be constructed to be very compact, and is therefore suitable to be applied in a level sensor system for multiple measurement locations as shown in FIG. 5. In such a level sensor, for each measurement location of multiple measurement locations, a tilt measuring device 20 may be provided to measure for each measurement location 8 a tilt variable of the substrate so that for each measurement location 8 the height determined by the level sensor 101 may be corrected for a tilt of the substrate 2.

Measurement Beam Delivery System

In FIG. 5, a top view of a level sensor 101 is shown configured to measure a height level of a substrate 2 at multiple measurement locations 108. This level sensor 101 provides the possibility to measure the height of the substrate 2 simultaneously at the different measurement locations 108. This level sensor further provides the possibility for open loop scanning of the measurement locations along the surface of the substrate 2. When desired, the tilt of the substrate 2 may be measured by one or more tilt measuring devices to correct the height measured by the level sensor 1 to correct the measured height for any effect due to a tilt of the substrate 2.

Although this level sensor provides possibilities for fast and accurate determination of a height map of a substrate 2, the level sensor as shown in FIG. 5 may require substantial space above the substrate 2. Such space may not always be available above the substrate in a lithographic apparatus.

Figure 8:
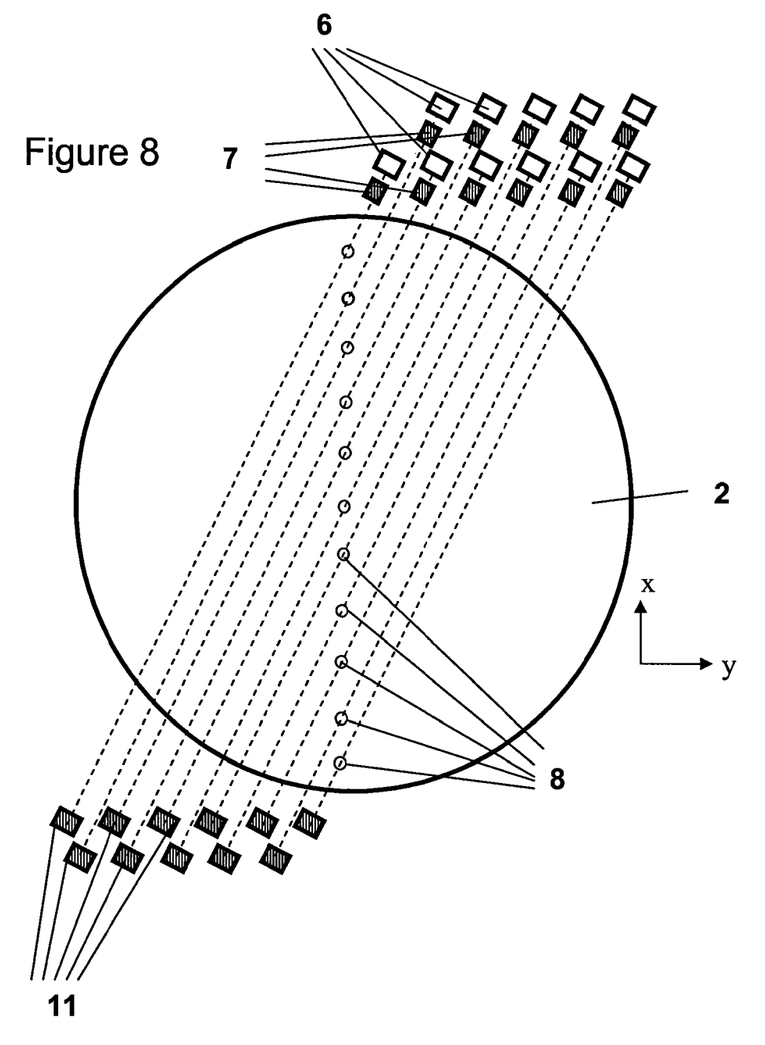
FIG. 8 depicts a top view of an embodiment of a beam delivery system for a multiple measurement location level sensor.

To use the space available in a lithographic apparatus more efficiently, FIG. 8 shows an alternative beam delivery method to provide measurement beams at multiple measurement locations at the substrate which multiple measurement locations 8 are arranged on a line. The substrate 2 is arranged in a measurement position, i.e. at least one of the measurement locations 8 of the level sensor is located somewhere on the substrate 2 so that height measurement of the substrate 2 can be carried out.

For each measurement location 8, a radiation output 6, a projection grating 7, a detection grating 11 and three detectors (not shown) are provided. These components of the level sensor as such correspond to the components used in the level sensor shown in FIGS. 2 and 5. However, the radiation output 6 and the projection grating 7 are provided at one side next to the substrate 2, while the detection grating 11 and the detectors are provided at the other side next to the substrate 2. The different components may be located at different heights with respect to the substrate 2, but in the shown embodiment all components are arranged at a height level higher than the substrate 2.

An advantage of this arrangement is that no components are arranged above the substrate 2, and all components at one side of the substrate 2 are arranged relative closely to each other resulting in a relatively small space required for all components in a lithographic apparatus.

It is remarked that the term "next to" is used to indicate a location that when projected perpendicularly from the main plane of the substrate lies outside the substrate. The terms "above" or "below" indicate a location that when projected perpendicularly from the main plane of the substrate lies within the substrate.

Figure 9:
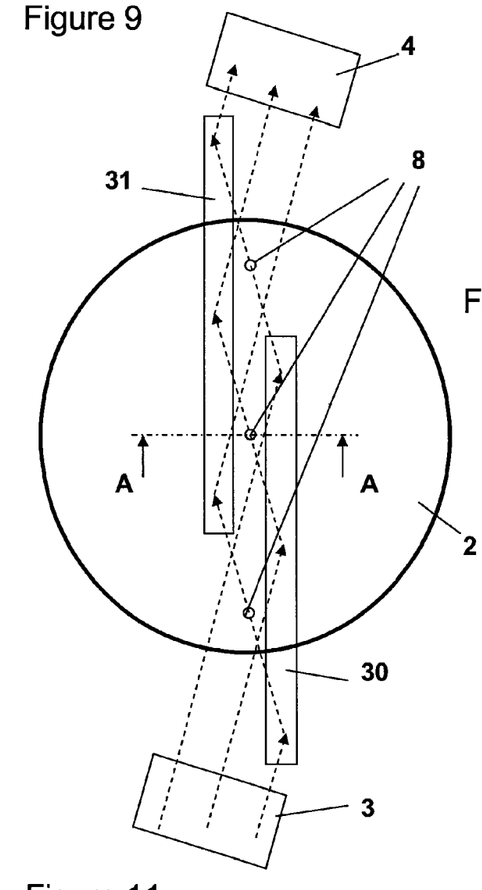
FIGS. 9, 10 and 11 depict a top view, a cross section and a side view of a further embodiment of a beam delivery system for a multiple measurement location level sensor.
Figure 10:
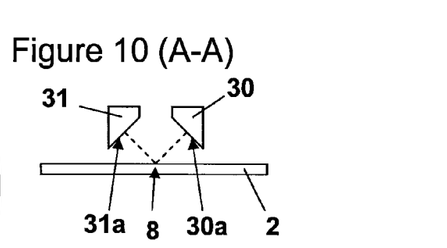
Figure 11:
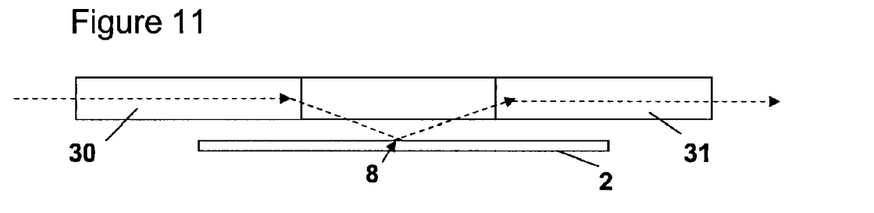

FIGS. 9, 10 and 11 show a further embodiment in which the space required for the measurement beams of the level sensor can be further reduced. In the embodiment of FIGS. 9, 10 and 11, reflection bars 30, 31 are provided above the substrate 2. The reflection bars 30, 31 are each provided with an oblique reflective surface 30a, 31a (see FIG. 10 which shows a view along line A-A in FIG. 9).

The angles of the oblique surfaces 30a, 31a are desirably equal with respect to the horizontal plane and are directed towards the surface of the substrate. The angles are chosen such that a measurement beam received by the reflection bar 30 in a substantially horizontal plane is reflected towards a measurement location 8 on the substrate 2. At the measurement location 8 the measurement beam is reflected back towards the reflection bar 31. The reflected beam is received on the reflection bar 31 at substantially the same height as where it was reflected on the reflection bar 30. From the reflection bar 31 the measurement beam is guided in a substantially horizontal direction to the detection unit 4.

In the detection unit 4 further optical elements may be provided to detect signals representative for the height of the substrate 2. These signals may be used to determine the height of the substrate 2 at the measurement location in a processing unit which may be arranged in the detection unit 4 or at any other suitable location. The components of the level sensor may correspond to the components of the above described embodiments, but any other suitable level sensor device may also be used.

The sensor components are depicted by a projection unit 3 and a detection unit 4. The projection unit 3 is configured to provide multiple measurement beams to measure a height level at different measurement locations 8 on the substrate 2. All measurement beams are provided at substantially the same height and directed to the reflection bar 30. All reflected measurement beams are received at substantially the same height by the reflection bar 31, and directed towards the detection unit 4.

An advantage of the measurement beam delivery device of the embodiment shown in FIGS. 9, 10, and 11 is that the measurement beam can be kept at a relatively low height level with respect to the substrate 2, while at the same time the projection unit 3 and the detection unit 4 are arranged next to the substrate where more space may be available for the provision of these units 3, 4.

In the embodiment shown in FIGS. 9, 10, and 11, only three measurement locations 8 are shown. In practice, many more measurement locations 8, for instance over 50 measurement locations, may be located at a line or in any other suitable configuration. Furthermore, the substrate 2 may be moved to move the measurement locations 8 over the substrate surface to determine the height level of the substrate over the complete surface of the substrate to determine a height map of the substrate. The movement may be realized by movements of the level sensor and/or movements of the substrate, or by any other suitable method.

It is remarked that the projection unit 3 and detection unit 4, when using the reflection bars 30, 31 may also be located partially or completely above the substrate in the measurement location.

Further, it is remarked that the projection unit 3 and/or detection unit 4 of the embodiments of FIGS. 8, 9, 10, and 11 may comprise compensation devices to compensate, when necessary, for any difference in measurement beam path length between the different measurement beams.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A combination of a movable substrate support configured to support a substrate and a level sensor configured to determine the height level of a surface of the substrate supported on the movable substrate support, comprising:
    multiple projection units, each projection unit configured to project a measurement beam on a measurement location on the substrate,
    multiple detection units, each detection unit arranged to receive the measurement beam after redirection by the substrate, and
    a processing unit to calculate the height level for each of the measurement locations on the basis of the measurement beams,
    wherein the level sensor is configured to measure the height levels simultaneously at multiple measurement locations on the substrate,
    wherein the substrate support is configured to move the substrate in a first direction substantially parallel to the surface of the substrate to measure the height level of the surface at different locations on the substrate, and
    wherein at least part of the multiple measurement locations are at least spaced in as second direction that is substantially parallel to the surface of the substrate and substantially perpendicular to the first direction.

2. The combination of claim 1, wherein each measurement beam substantially travels through a measurement plane extending in the first direction and a third direction perpendicular to the first and second direction.

3. The combination of claim 1, wherein the multiple measurement locations are arranged on a measurement line.

4. The combination of claim 1, wherein the multiple measurement locations are spaced equidistantly.

5. The combination of claim 1, wherein the multiple measurement locations substantially extend over a width of the substrate in the second direction.

6. The combination of claim 1, wherein the substrate support is configured to move the substrate in the first direction with a substantially constant speed when measuring the height levels of the substrate at the different locations on the substrate.

7. The combination of claim 1, wherein the substrate support is configured to move the substrate without closed loop height control when measuring height levels of the substrate at different locations on the substrate.

8. The combination of claim 1, wherein each projection unit comprises:
    a radiation outlet to provide a measurement beam, and
    a projection grating arranged to receive the measurement beam and to impart the measurement beam with a substantially periodic radiation intensity, and
    wherein each detection unit comprises:
    a detection grating arranged to receive the redirected measurement beam, the detection grating comprising at least one array of three or more segments together having a length substantially equal to a length of a period of the measurement beam projected on the detection grating, and wherein the three or more segments are configured to split the redirected measurement beam in three or more redirected measurement beam parts, and
    three or more detectors each arranged to receive one of the three of more measurement beam parts, and
    wherein the processing unit is arranged to calculate the height level on the basis of the measurement beam parts received by the three or more detectors.

9. The combination of claim 8, wherein top surfaces of the at least one array of three or more segments have different angles with respect to the angle of incidence of the measurement beam.

10. The combination of claim 1, wherein the projection units and the detection units are arranged next to the substrate, when the substrate is arranged in a measurement position.

11. The combination of claim 1, wherein the level sensor comprises a first reflection bar arranged to receive the multiple measurement beams from the projection units, and to direct the measurement beams to the substrate, and a second reflection bar arranged to receive the reflected multiple measurement beams from the projection units, and to direct the measurement beams to the detection units.

12. The combination of claim 11, wherein the first reflection bar is configured to receive the multiple measurement beams from the projection units in a plane substantially parallel to a main plane of the substrate.

13. The combination of claim 1, wherein the level sensor further comprises a tilt measuring device, the tilt measuring device arranged to receive at least partially the redirected measurement beam, and configured to provide a tilt signal representative for a tilt of the substrate with respect to a nominal plane, and wherein the tilt measuring device is connected to the processing unit to feed the tilt signal to the processing unit in order to correct the height level on the basis of the tilt of the substrate.

14. A method for determining a height map of a substrate for use in a lithographic process, the method comprising:
   providing the combination of claim 1;
   providing the substrate;
   measuring the height of the substrate at the measurement locations by projecting the measurement beams on the substrate using the projection units, receiving the redirected beams using the detection units, and determining the height levels in the processing unit;
   repeating the measuring for the multiple locations on the substrate; and
   determining the height map of the substrate on the basis of the height levels at the multiple locations.

15. A lithographic apparatus comprising:
   a support constructed to support a patterning device, the patterning device being capable of providing a radiation beam having a pattern in its cross-section;
   a movable substrate table constructed to hold a substrate;
   a projection system configured to project the patterned radiation beam onto a target portion of the substrate; and
   a level sensor configured to determine a height level of a surface of the substrate supported on the substrate table, the level sensor comprising:
   multiple projection units, each projection unit configured to project a measurement beam on a measurement location on the substrate,
   multiple detection units, each detection unit arranged to receive a measurement beam after redirection by the substrate, and
   a processing unit to calculate the height level on the basis of the measurement beams,
   wherein the level sensor is configured to measure the height levels simultaneously at multiple measurement locations on the substrate,
   wherein the substrate table is configured to move the substrate in a first direction substantially parallel to the surface of the substrate, and
   wherein at least part of the multiple measurement locations are at least spaced in a second direction that is substantially parallel to the surface of the substrate and substantially perpendicular to the first direction.

16. A method for determining a height map of a substrate for use in a lithographic process, the method comprising:
   projecting a plurality of measurement beams on respective measurement locations on the substrate using multiple projection units;
   receiving each of the measurement beams after redirection by the substrate using a respective detection unit of a plurality of detection units;
   calculating a height level for each of the measurement locations on the basis of the measurement beams in order to measure the height levels simultaneously at the multiple measurement locations on the substrate; and
   moving the substrate in a first direction substantially parallel to the surface of the substrate to measure the height level of the surface at different locations on the substrate; and
   determining the height map of the substrate on the basis of the height levels measured at the different locations,
   wherein at least part of the multiple measurement locations are at least spaced in a second direction that is substantially parallel to the surface of the substrate and substantially perpendicular to the first direction.

* * * * *